United States Patent
Suzuki et al.

(10) Patent No.: US 7,394,408 B2
(45) Date of Patent: Jul. 1, 2008

(54) NETWORK INTEGRATED DATA COMPRESSION SYSTEM

(75) Inventors: Norihisa Suzuki, Los Altos Hills, CA (US); Mark Marrin, Santa Clara, CA (US)

(73) Assignee: Zaxel Systems, Inc., Los Altos Hills, CA (US)

( * ) Notice: Subject to any disclaimer, the term of this patent is extended or adjusted under 35 U.S.C. 154(b) by 0 days.

(21) Appl. No.: 11/558,873

(22) Filed: Nov. 10, 2006

(65) Prior Publication Data

US 2007/0152852 A1    Jul. 5, 2007

Related U.S. Application Data

(60) Provisional application No. 60/756,886, filed on Jan. 5, 2006.

(51) Int. Cl.
*H03M 7/00* (2006.01)
(52) U.S. Cl. .......................................... 341/50; 341/51
(58) Field of Classification Search ................. 341/106, 341/107, 51, 50; 375/E7.198, E7.211; 719/331
See application file for complete search history.

(56) References Cited

U.S. PATENT DOCUMENTS

| | | | | |
|---|---|---|---|---|
| 5,539,908 A | * | 7/1996 | Chen et al. | 719/331 |
| 5,768,597 A | * | 6/1998 | Simm | 717/174 |
| 6,385,656 B1 | * | 5/2002 | Appelman | 709/247 |
| 6,968,424 B1 | | 11/2005 | Danilak | |
| 2005/0125384 A1 | | 6/2005 | Gilfix et al. | |

OTHER PUBLICATIONS

Anonymous, "What does e2compr do?" Oct. 12, 2007, XP002454795, http://e2compr.sourceforge.net/manual-0.4/e2compr-0.4_3.html#SEC3.
Tetsuji, Kawashima, et al., "A Universal Compressed Data Format for Foreign File Systems," Mar. 28, 1995, Data Compression Conference, Proceedings, IEEE Computer Society Press, Los Alamitos, CA.
Flouris, M., et al., "Violin: A Framework for Extensible Block-Level Storage," Apr. 11, 2005, Mass Storage Systems and Technologies, 22nd IEEE / 13th NASA Goddard Conference on Monterey, Piscataway, NJ, XP010790497, pp. 128-142.

(Continued)

*Primary Examiner*—Brian Young
(74) *Attorney, Agent, or Firm*—Michael A. Glenn; Glenn Patent Group

(57) ABSTRACT

A data compression system enables user-level applications to compress and decompress files to save storage space even for user-level applications that are not modified to use compressed files. User preferences associated with a user terminal are established for the compression of data, e.g. video data, wherein the user preferences comprise selective enablement of compression for at least one file type. An exemplary system determines the type of a digital data file, e.g. a digital video data file, being output from an application or input to an application, and performs transparent file-type-based compression or decompression of the digital data file, if enabled by the established user preferences. Files of the selected file types are stored with compressed formats and may even have different names, but are shown to user-level applications to have the same file names and file sizes as original uncompressed files. Therefore, the existing applications can perform operations without any disruptions. The transparent compression can be implemented within a variety of dedicated and/or distributed network configurations, as well as on a single workstation.

28 Claims, 12 Drawing Sheets

OTHER PUBLICATIONS

Anonymous, "How NTFS Works," Mar. 28, 2003, XP0002419412, http://technet2.microsfot.com/WindosServer/en/library/8cc5891d-bf8e-4164-862d-dac5418c59481033.mspx?mfr=true.

Praveen, B., et al., "Design and Implementation of a File System with On-the-Fly Data compression for GNU/Linux," Aug. 1999, Software Practice & Experience, Wiley & Sons, XP000834573, vol. 29, No. 10, pp. 863-874.

Border, J., et al., "Internet Engineering Task Force: Performance Enhancing Proxies," Jun. 25, 1999, XP002454796, http://www3.ietf.org/proceedings/99jul/I-D/draft-ietf-pilc-pep-00.txt.

Anonymous, "Transplant Compression Using Lofi," Jan. 19, 2006, XP002454797, http://blogs.sun.com/moinakg/entry/transparent_compression_using_lofil.

* cited by examiner

NETWORK INTEGRATED DATA COMPRESSION SYSTEM

CROSS-REFERENCE TO RELATED APPLICATIONS

This application claims priority to U.S. Provisional Patent Application No. 60/756,886, entitled Network Integrated Video Compression, filed 5 Jan. 2006, which is incorporated herein in its entirety by this reference thereto.

FIELD OF THE INVENTION

The invention relates to the field of compression systems. More particularly, the invention relates to a structure and process for the controlled compression of digital data files, such as but not limited to video files, in any of a network environment and a standalone computer system.

BACKGROUND OF THE INVENTION

The amount of uncompressed digital video data stored at film studios and postproduction facilities is currently increasing rapidly. This causes tremendous financial burdens because new investment for storage and network equipment must be made, which also results in a significant increase in electricity bills.

The currently preferred technology to cope with the expansion of digital video data is mathematically lossless compression. In mathematically lossless compression, digital video files are compressed for transmission and storage, while the contents are the same as the original files when they are decompressed. Thus, both storage space and transmission time are saved.

However, mathematically lossless compression technology has been difficult to incorporate within computing systems, since application programs from disparate vendors are required to be modified.

Traditional compression typically comprises blind content compression systems. Existing blind content compression systems, such as zip, tar, etc., typically perform generic compression to files, without consideration as to the precise file structure of the files themselves. However, file formats often have widely varying construction, such that generic blind compression provides a wide spectrum of performance. The generic nature of such blind compression often doesn't work, particularly for video compression.

OS supported codecs such as Directshow™ filters are typically implemented for specific compression of consumer video files, and can inherently result in performance bottlenecks and/or quality limitations. For example, Directshow™, a multimedia architecture available through Microsoft, Inc., of Redmond, Wash., such as provided for a variety of Windows™ operating systems, typically divides multimedia system processing tasks through a set of filters.

Application specific application programming interfaces (APIs), e.g. such as Adobe Premiere™ SDK, typically depend upon third party APIs for performance, and require integration and support that is specific to applications for which they are implemented.

While some compression programs are ideally suited for a specified file format, e.g. *.tgz, *.bmp, etc., a user is required to knowledgably know what file type each file is, and then is required to apply the desired compression program, to create a compressed file to be stored.

It would be advantageous to provide a system that performs file-type-based compression, without ongoing user intervention. As well, it would be beneficial to provide a compression system that is easily scaled to provide file-type-based compression for one or more users, with minimal hardware requirements.

For example, the motion picture industry commonly produces vast amounts of video data files for each of numerous film projects at any given time. Raw film and digital footage are often collected, stored and edited. The required storage for such memory intensive operations is staggering, and the industry continually has to invest in hardware and software dedicated to these tasks.

It would therefore be beneficial to provide a compression system that can be readily implemented to be integrated with existing equipment, for a wide variety of computer systems, across a wide variety of system environments, e.g. networks, to save both money and time for such entities.

As well, it would be extremely beneficial to provide networked compression and storage, which can offload hardware and software requirements for dedicated terminals.

It would also be advantageous to provide a data compression system and an associated process that provide transparent file-type-based compression for one or more users. The development of such a data compression system would constitute a major technological advance.

SUMMARY OF THE INVENTION

A system and process are provided for transparent data compression within networked systems. This system enables user-level applications to compress and decompress files to save storage space even if the user-level applications are not modified to use compressed files. User preferences associated with a user terminal are established for the compression of data, e.g. video data, wherein the user preferences comprise selective enablement of compression for at least one file type. An exemplary system determines the type of a digital data file, e.g. a digital video data file, being output from an application or input to an application, and performs transparent file-type-based compression or decompression of the digital video data file, if enabled by the established user preferences. Files of the selected file types are stored with compressed formats and may even have different names, but are shown to all user-level applications to have the same file names and file sizes as original uncompressed files. Therefore, the existing applications can perform operations without any disruptions. The transparent compression can be implemented within a variety of dedicated and/or distributed network configurations as well as on a single workstation.

DETAILED DESCRIPTION OF PREFERRED EMBODIMENTS

Figure 1:
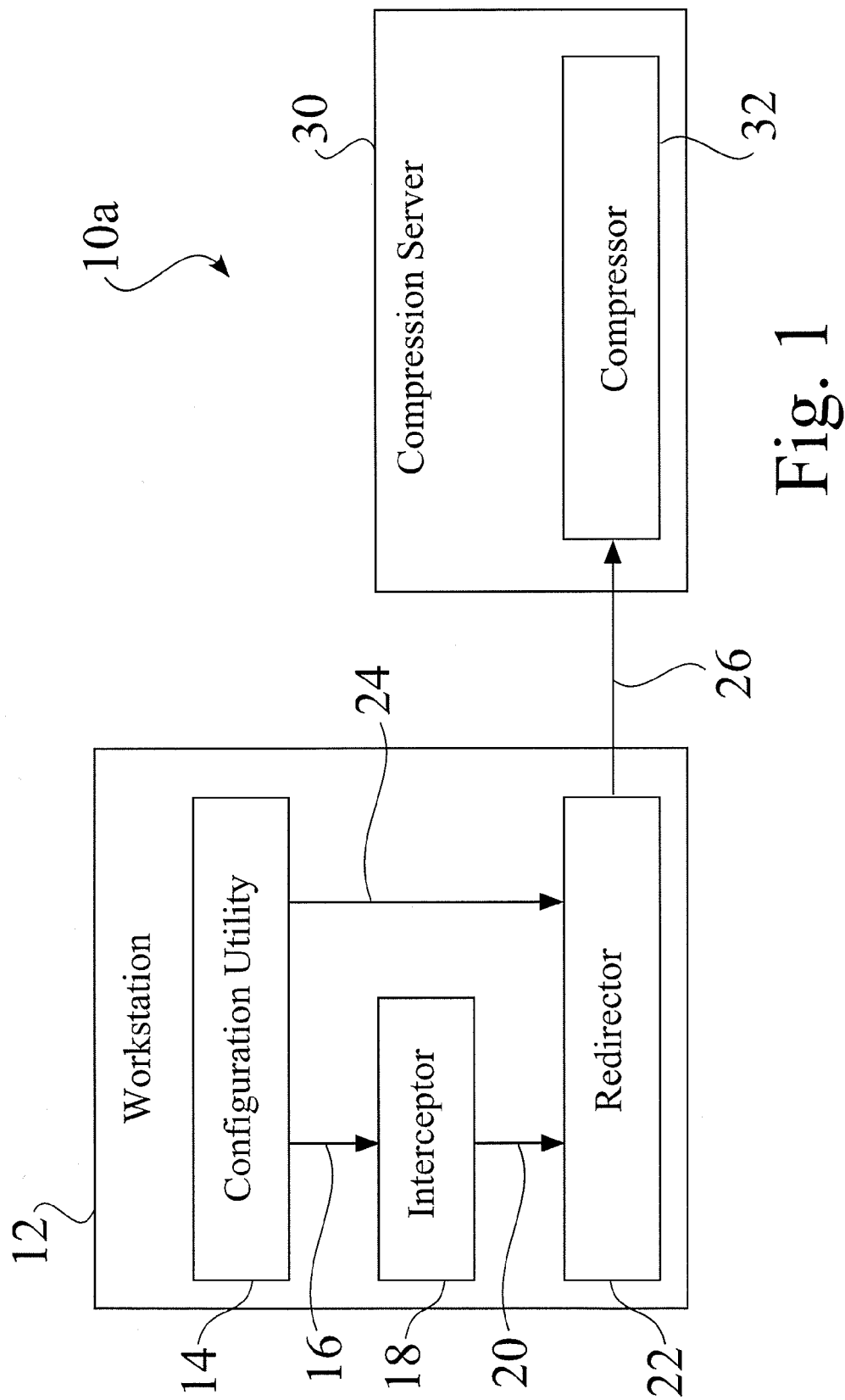
FIG. 1 shows control flow in a first exemplary embodiment of a network integrated data compression system.

FIG. 1 shows control flow in a first exemplary embodiment of a network integrated data compression system 10a, such as between software components. In the exemplary system 10a seen in FIG. 1, a configuration utility 14 comprises a workstation configuration application 14, an interceptor 18 comprises a workstation filter driver 18, and a redirector 22 comprises a workstation service application 22, while a compressor component 32 comprises a server service application 32 at a compression server 30.

Figure 2:
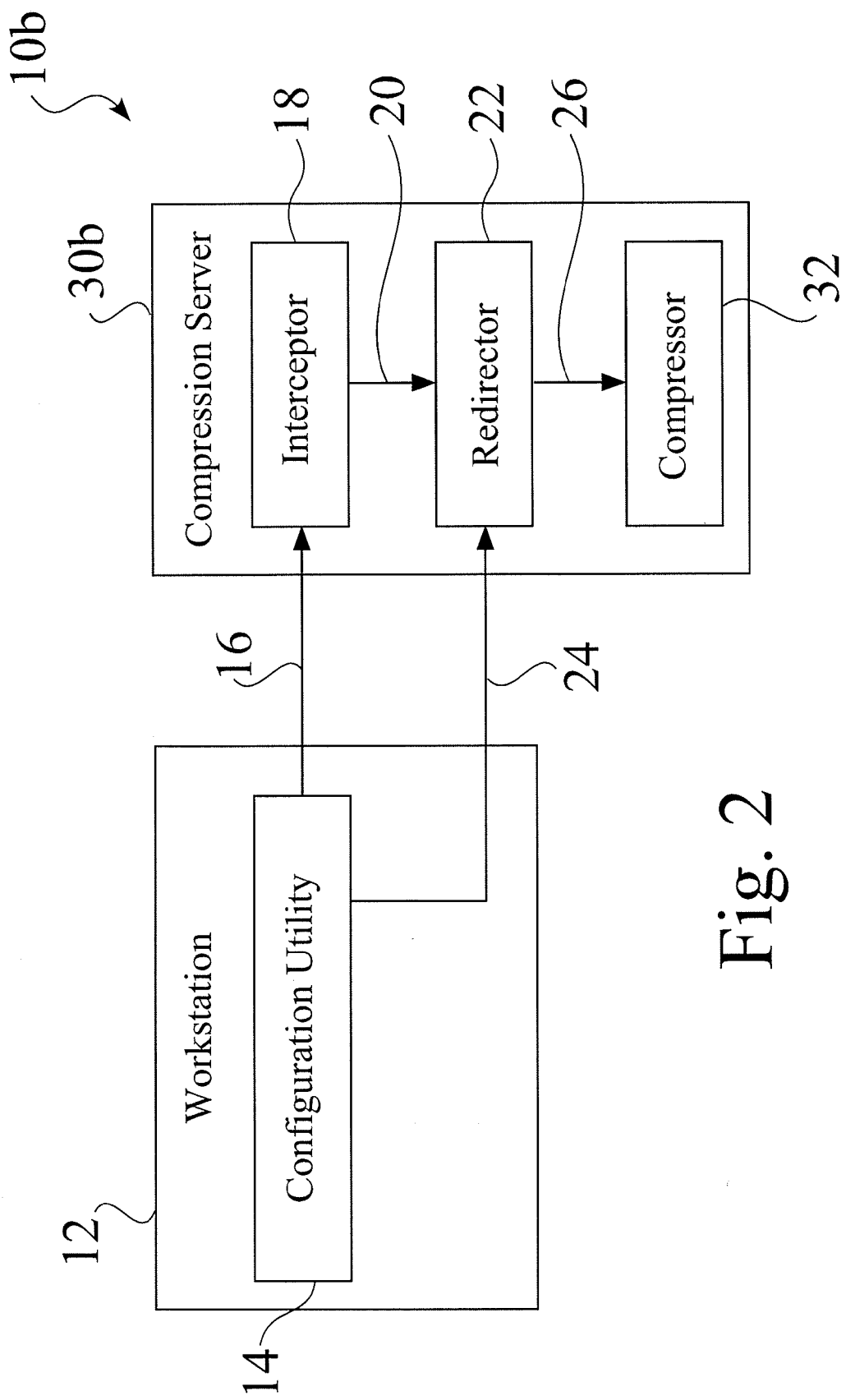
FIG. 2 shows control flow in a second exemplary embodiment of a network integrated data compression system.

FIG. 2 shows control flow in a second exemplary embodiment of a network integrated data compression system 10b, wherein a configuration utility 14 comprises a workstation configuration application 14, while the interceptor 18 comprises a filter driver 18 located at the compression server 32, the redirector 22 comprises a service application 22 at the compression server 32, and the compressor component 32 comprises a server service application 32 at the compression server 30.

In some system embodiments 10, one or more compression servers 30 comprise Zaxel Compression Servers, such as ZLC Server, available through Zaxel Systems, Inc., of Sunnyvale, Calif.

In the exemplary systems 10 shown in FIG. 1 and FIG. 2, the configuration utility 14 typically runs as a user mode application 14 on the user workstation, i.e. terminal 12. The configuration utility 14 allows users USR (FIG. 8, FIG. 11) to set, i.e. select 87, such as with a server marker 87 (FIG. 7) server names 85, e.g. 85a (FIG. 7), and/or to enable/disable 80 (FIG. 6) compression or decompression 114, 138. The configuration utility 14 may preferably comprise a front end for critical error reporting from the rest of the system 10.

Based on system functions, the configuration utility 14 interacts, i.e. communicates with the redirector 22 and/or the interceptor 18. For example, as seen in FIG. 1 and FIG. 2, the configuration utility 14 may transfer 24 settings, such as entered by a user USR through a configuration interface 72, e.g. 72a (FIG. 6), 72b (FIG. 7), to the redirector 22. Data files 152 from the configuration utility application 14 are directly received by the interceptor 18.

Figure 6:
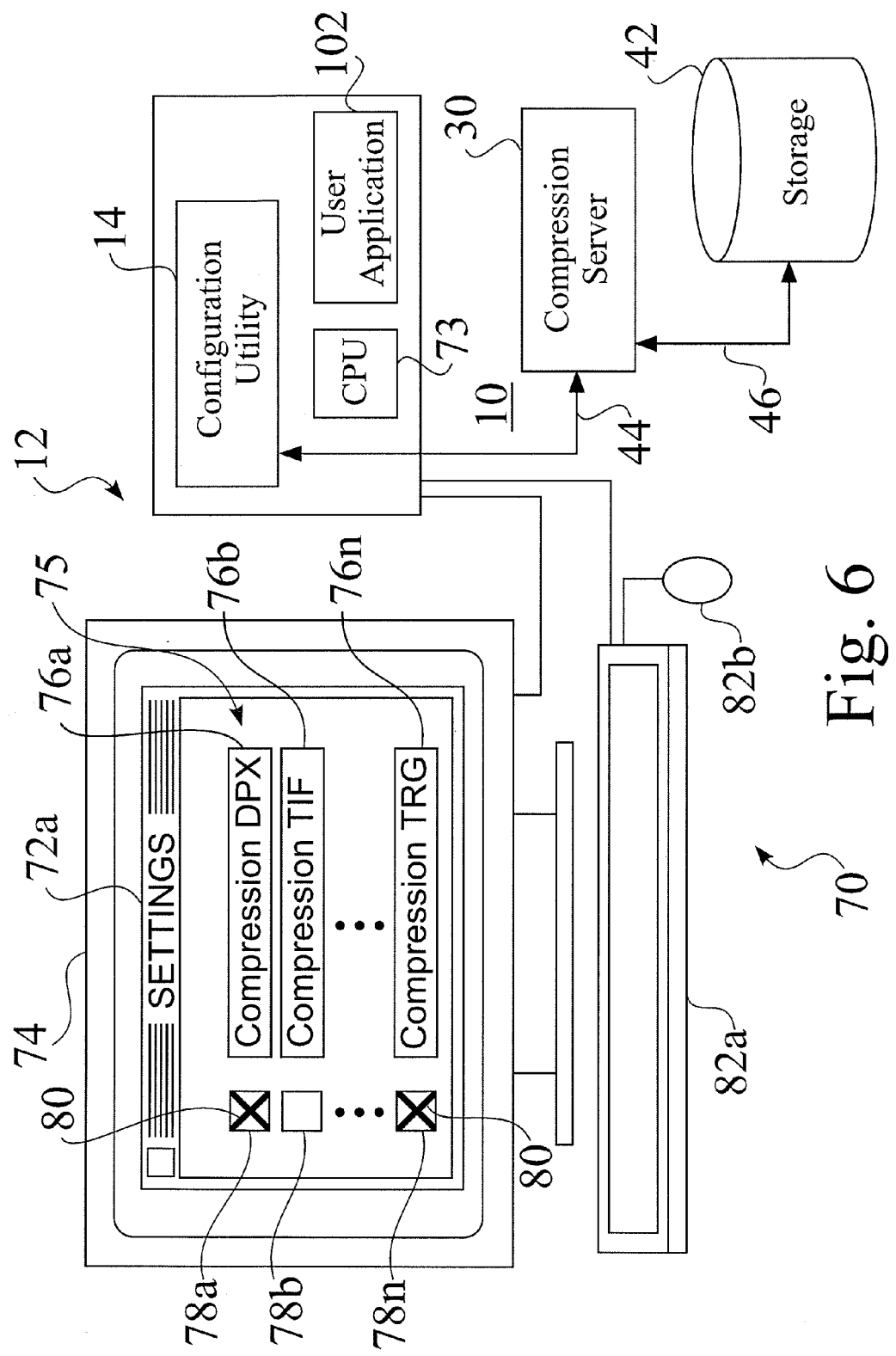
FIG. 6 is an exemplary schematic diagram for establishment of user preference settings through a configuration interface for an integrated data compression system.
Figure 9:
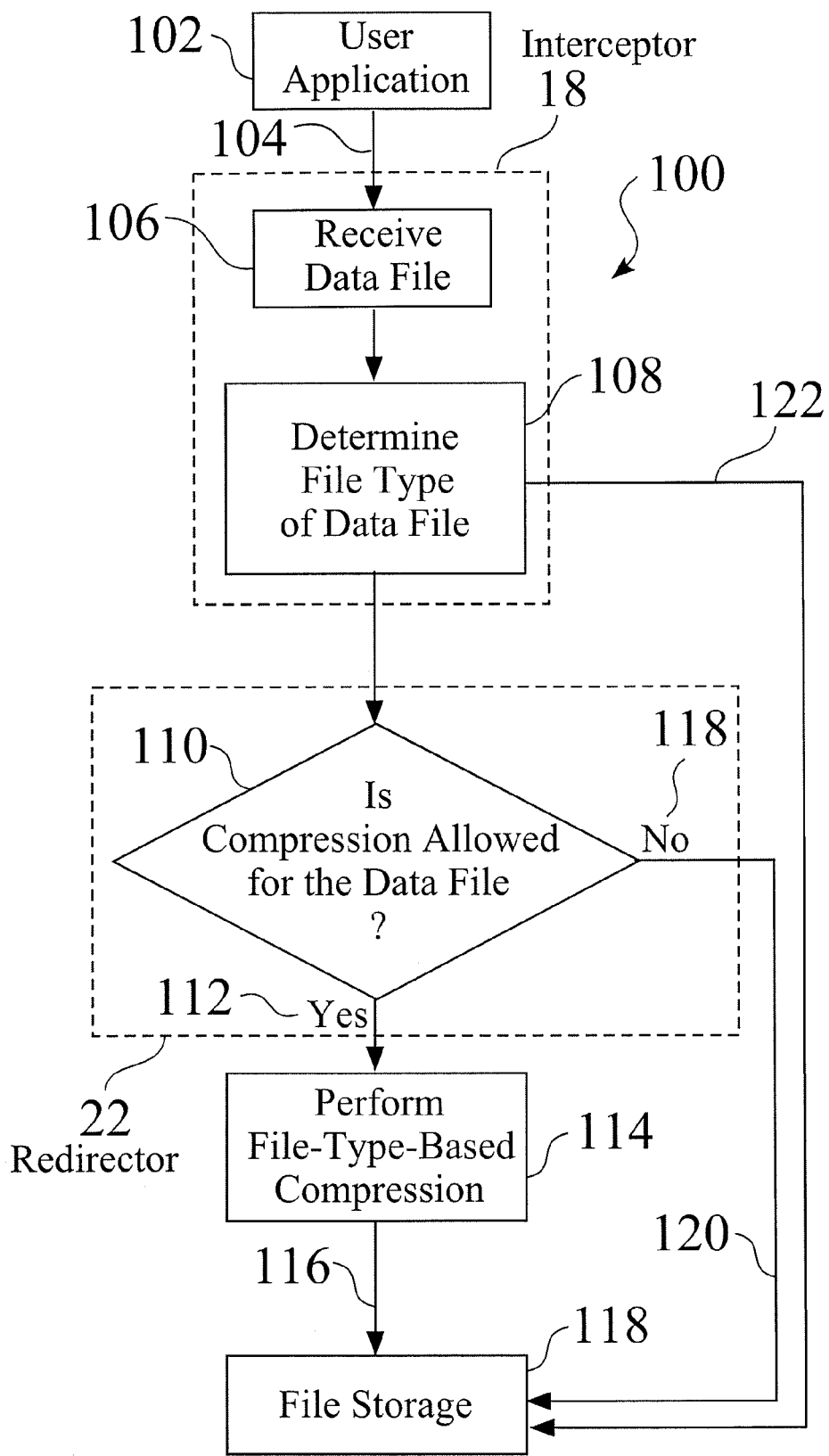
FIG. 9 is a process flow diagram for file-type-based compression in an integrated data compression system.
Figure 10:
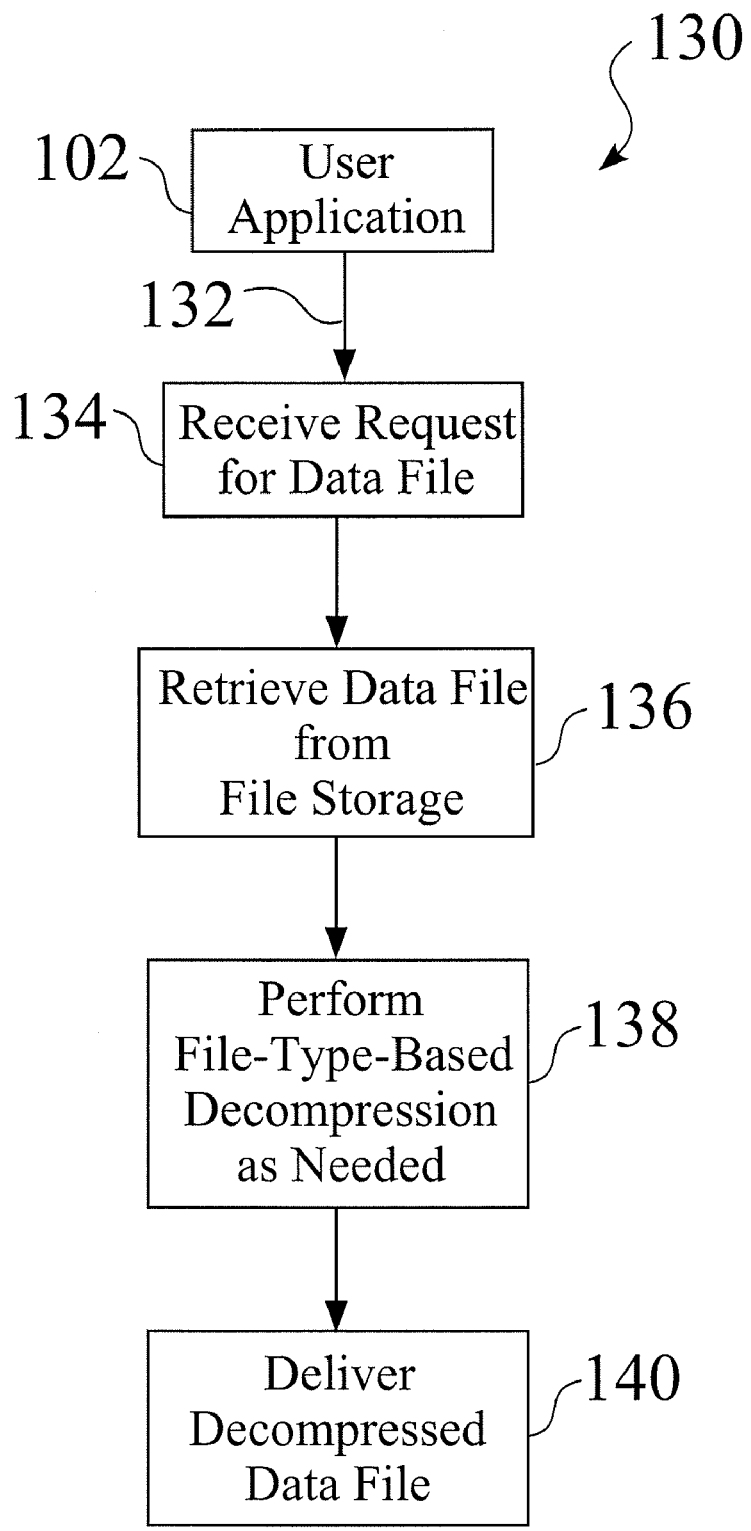
FIG. 10 is a process flow diagram for file-type-based decompression and delivery in an integrated data compression system.
Figure 11:
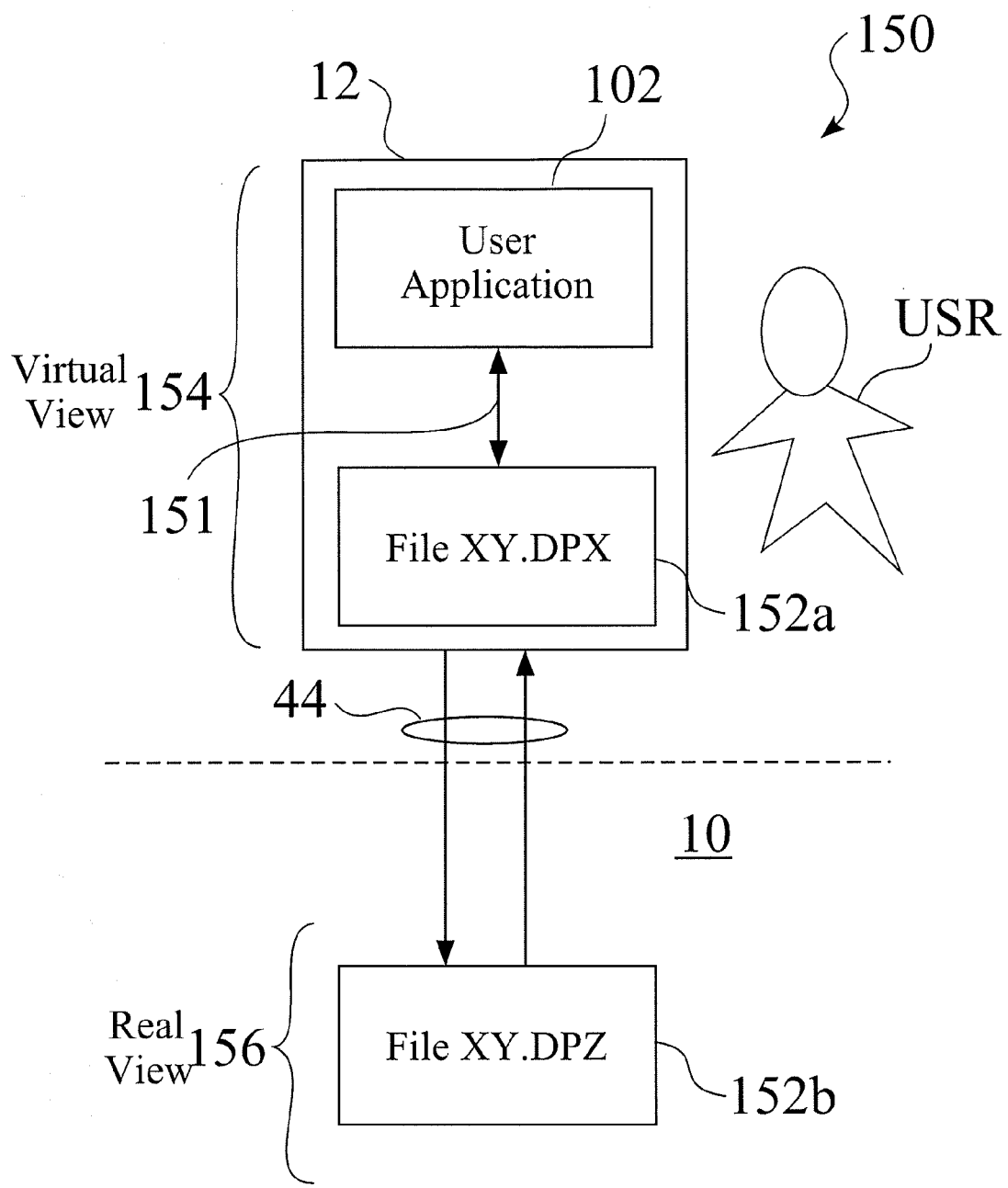
FIG. 11 is a schematic illustration of a virtual view and an associated real view associated with a user experience with an exemplary embodiment of an integrated data compression system.

The interceptor 18 is typically associated with input/output (IO) for the system 10, such as to see all input headed into the file system 10, e.g. such as incoming files 152 to be selectively compressed or requests for files 152, and to see all output delivered by the system 10, e.g. such as outgoing files 152 to be delivered back toward the user USR, such as through a user application 102 (FIG. 9 to FIG. 11). The interceptor selectively forwards IO headed to the redirector 22, based on user settings, e.g. such as but not limited to dpx, cin, tif, *.tgz and/or *.bmp compression enablement settings 78, 80 (FIG. 6).

In some exemplary system embodiments 10, the interceptor 18 is implemented as a filter driver, such as running in kernel mode. In some system embodiments 10, the interceptor 18 comprises a standard filter driver component 18, such as used for encryption, antivirus, and/or archiving systems.

In some system embodiments 10, the redirector 22 may comprise a service application 22 at a user workstation 12, such as seen in FIG. 1, or a service application 22 at the compression server 32, such as seen in FIG. 2. The redirector 22 typically communicates with the interceptor 18, such as through IOCTL, and with the compressor via standard sockets. In most system embodiments 10, the redirector 22 keeps work out of the kernel.

As seen in the exemplary systems 10 shown in FIG. 1 and FIG. 2, the compressor 32 typically comprises a server service application 32 at a compression server 30, which in some system embodiments comprises a dedicated server 30. The compression server 30 may preferably comprise a Zaxel server, as described above. The compressor application 32 typically handles all the compressed file translation for which the compressor 32 is assigned by the system 10, such as for selective compression 114 (FIG. 9) and decompression 138 (FIG. 10), as provided by the system and preferably as selected by a user USR, e.g. through the configuration utility 14.

Figure 3:
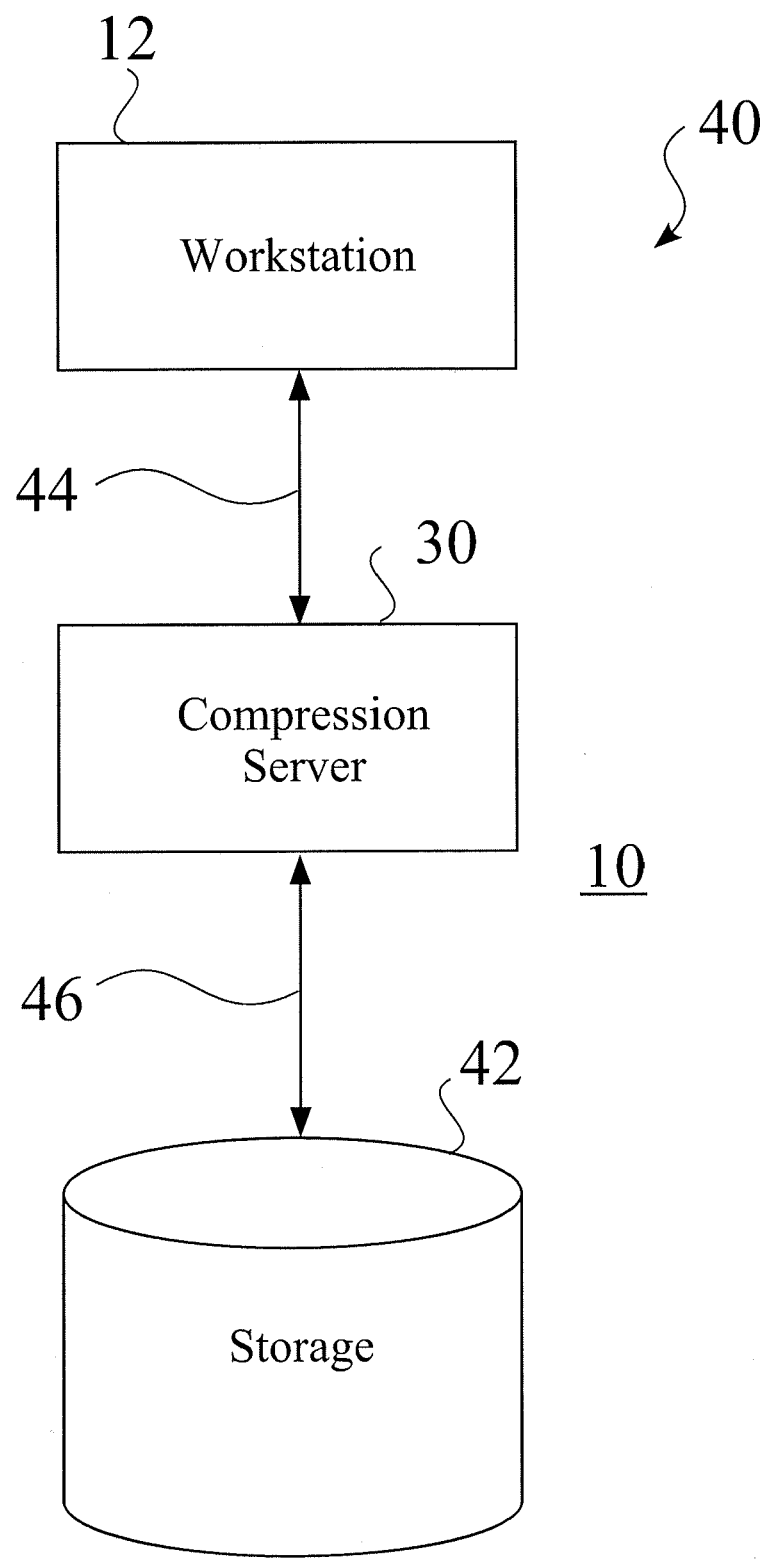
FIG. 3 is a basic schematic diagram of a network integrated data compression system for a single client.
Figure 4:
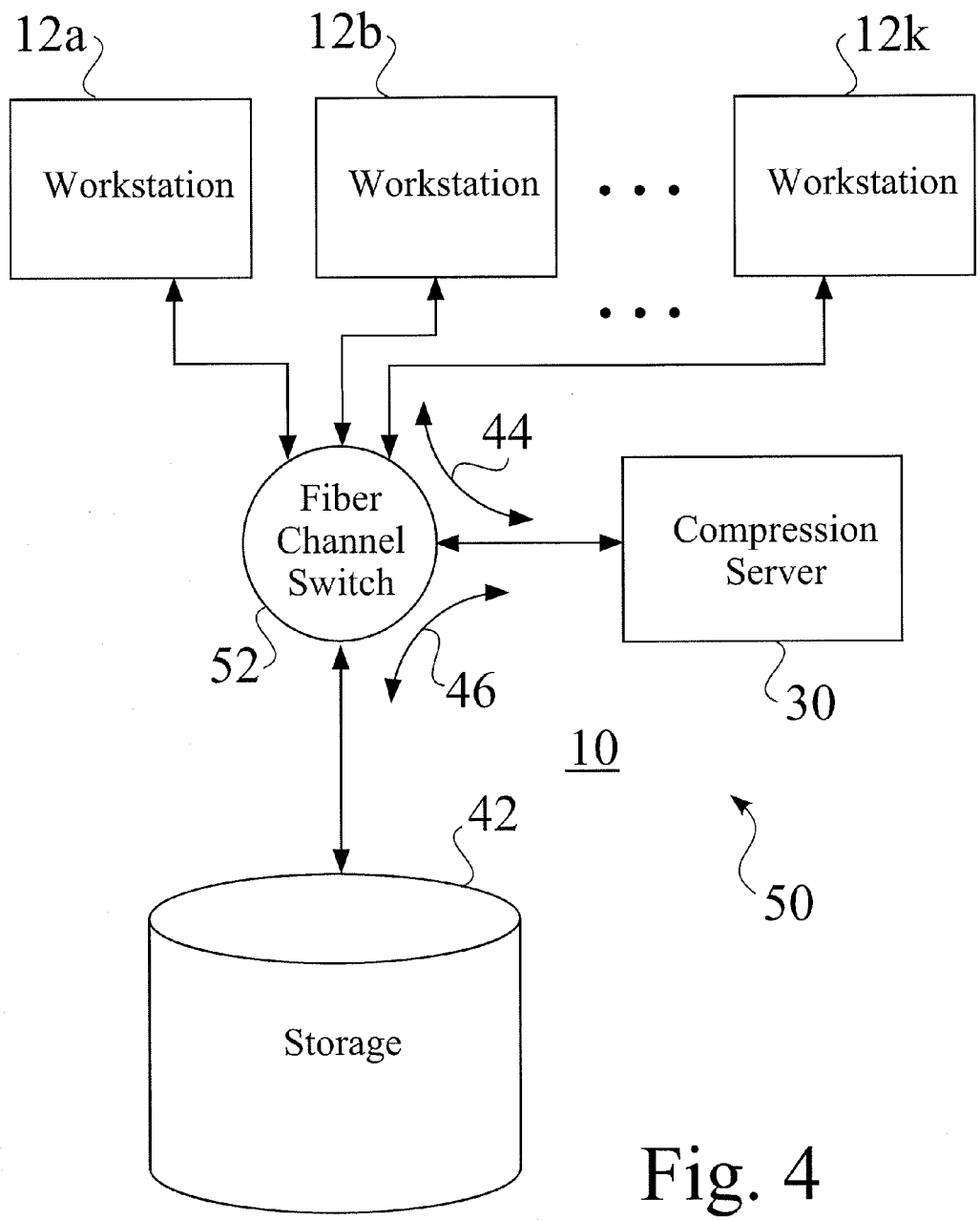
FIG. 4 is a basic schematic diagram of an exemplary embodiment of an integrated data compression system for multiple clients.
Figure 8:
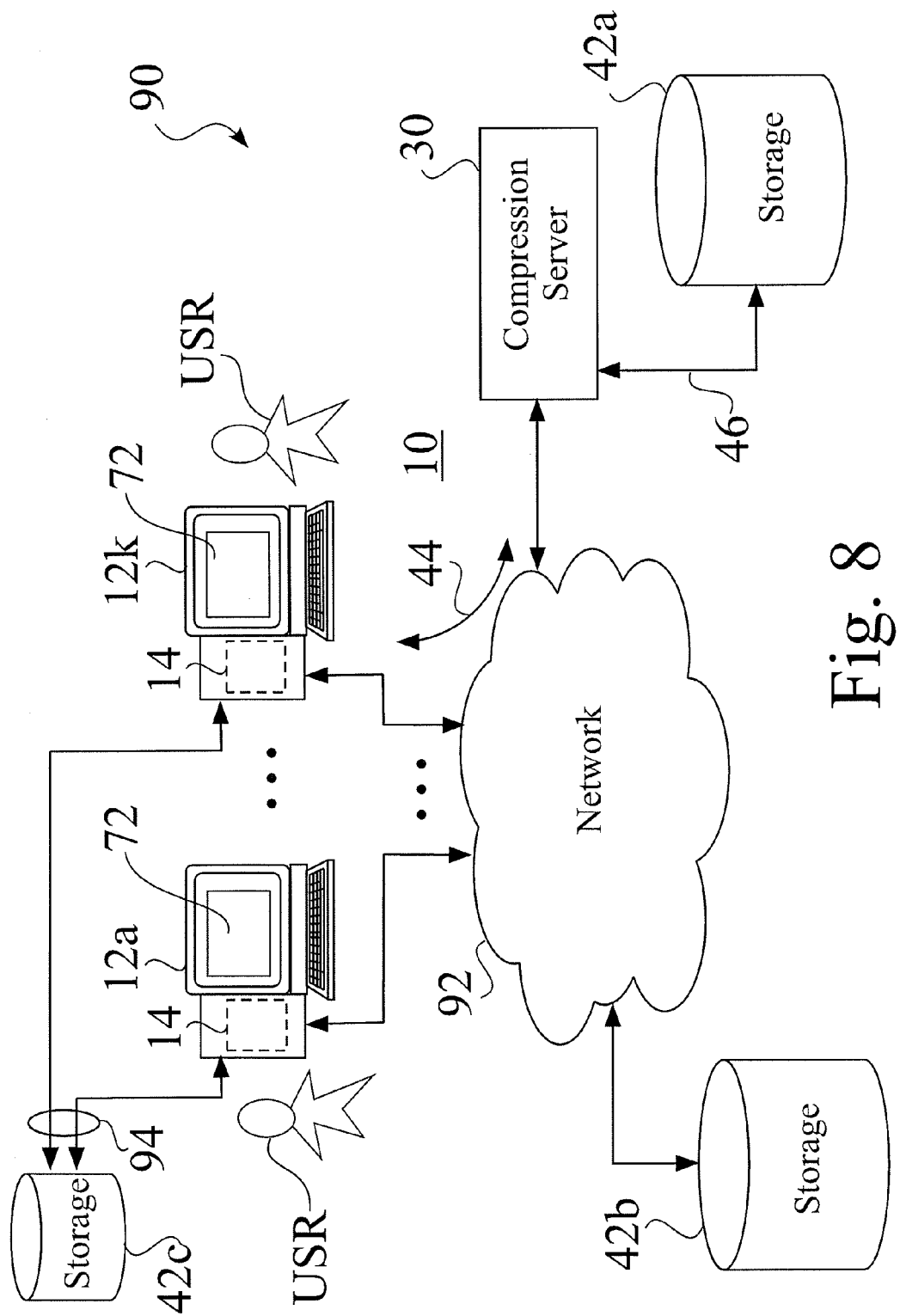
FIG. 8 is a schematic diagram for establishment of user preference settings through a configuration interface for a networked integrated data compression system serving multiple user terminals.

The integrated data compression system 10 can be implemented across a wide variety of system architectures. For example, FIG. 3 is a basic schematic diagram 40 of a network integrated data compression system 12 for a single client terminal 12. FIG. 4 is a basic schematic diagram 50 of an exemplary embodiment of an integrated data compression system 10 for multiple client terminals 12, such as through a switch 52, e.g. a fiber channel switch 52. As seen in the exemplary networked integrated data compression system 10 shown in FIG. 4, one or more user terminals, i.e. workstations 12, e.g. 12a-12k may be connected 44 through a switch 52 to the compression server 30, such as for interconnection 26 between redirectors 22 and the compressor module 32, as seen in the exemplary system 10a shown in FIG. 1, or for associated interconnections 16, 24 between the configuration utility 14 and the interceptor 18 and redirector 22, as seen in the exemplary system 10b shown in FIG. 2. As seen in FIG. 8, some embodiments of the integrated data compression system 10 that serve multiple client terminals 12 are implemented across a network 92, such as but not limited to a local area network (LAN), a wide area network (WAN), and/or the Internet. An alternate embodiment of the integrated data compression system 10 comprises one computer enclosure, such that a terminal 12, compression server 30, and storage 42 of FIG. 3 are enclosed in one computer system.

Figure 5:
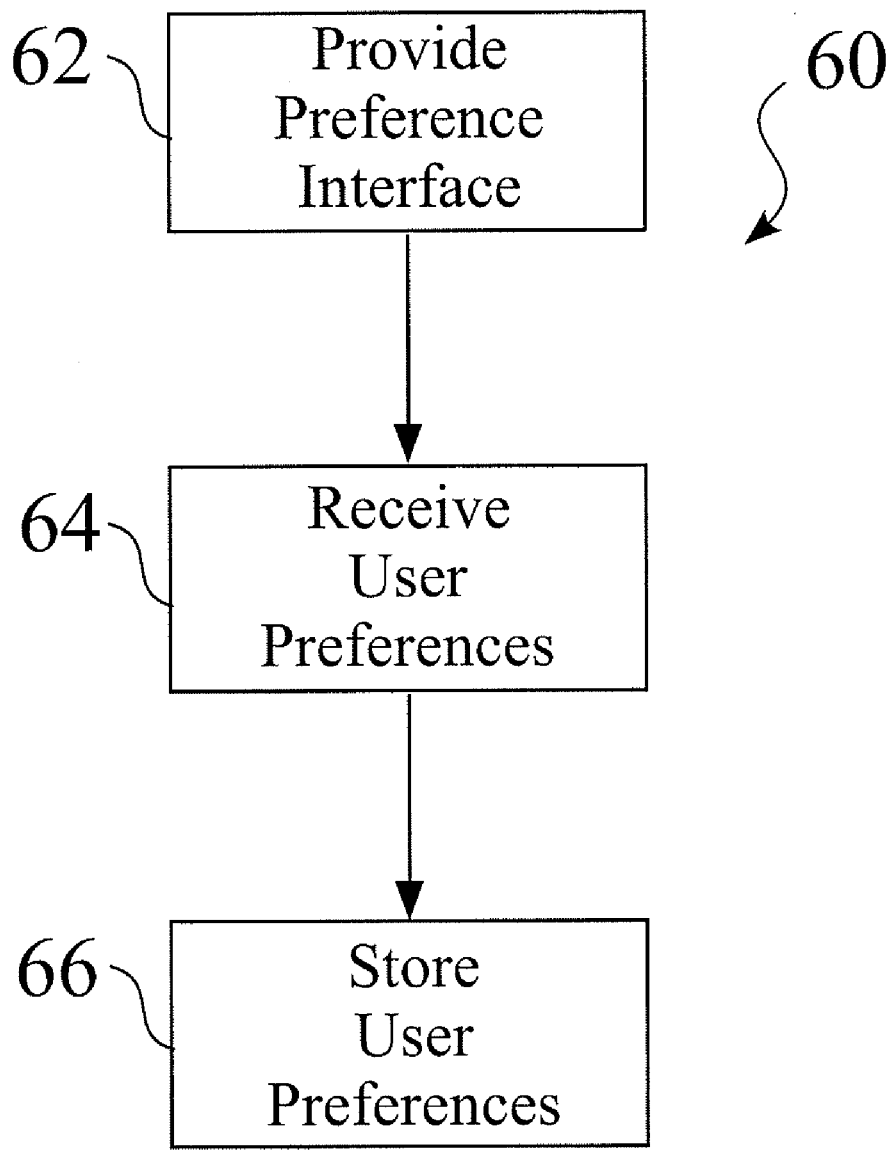
FIG. 5 is an exemplary process flow diagram for establishment of user preference settings within an integrated data compression system.

FIG. 5 is an exemplary process flow diagram for establishment 60 of user preference settings an integrated data compression system 10. The system 10 may typically provide 62 a configuration preference interface 72, e.g. 72a (FIG. 6), 72b (FIG. 7), through which the system 10 receives 64 user preferences. The system 10 then typically stores 66 the system preferences, such as to direct operation of the interceptor 18 and/or the redirector 22.

Figure 7:
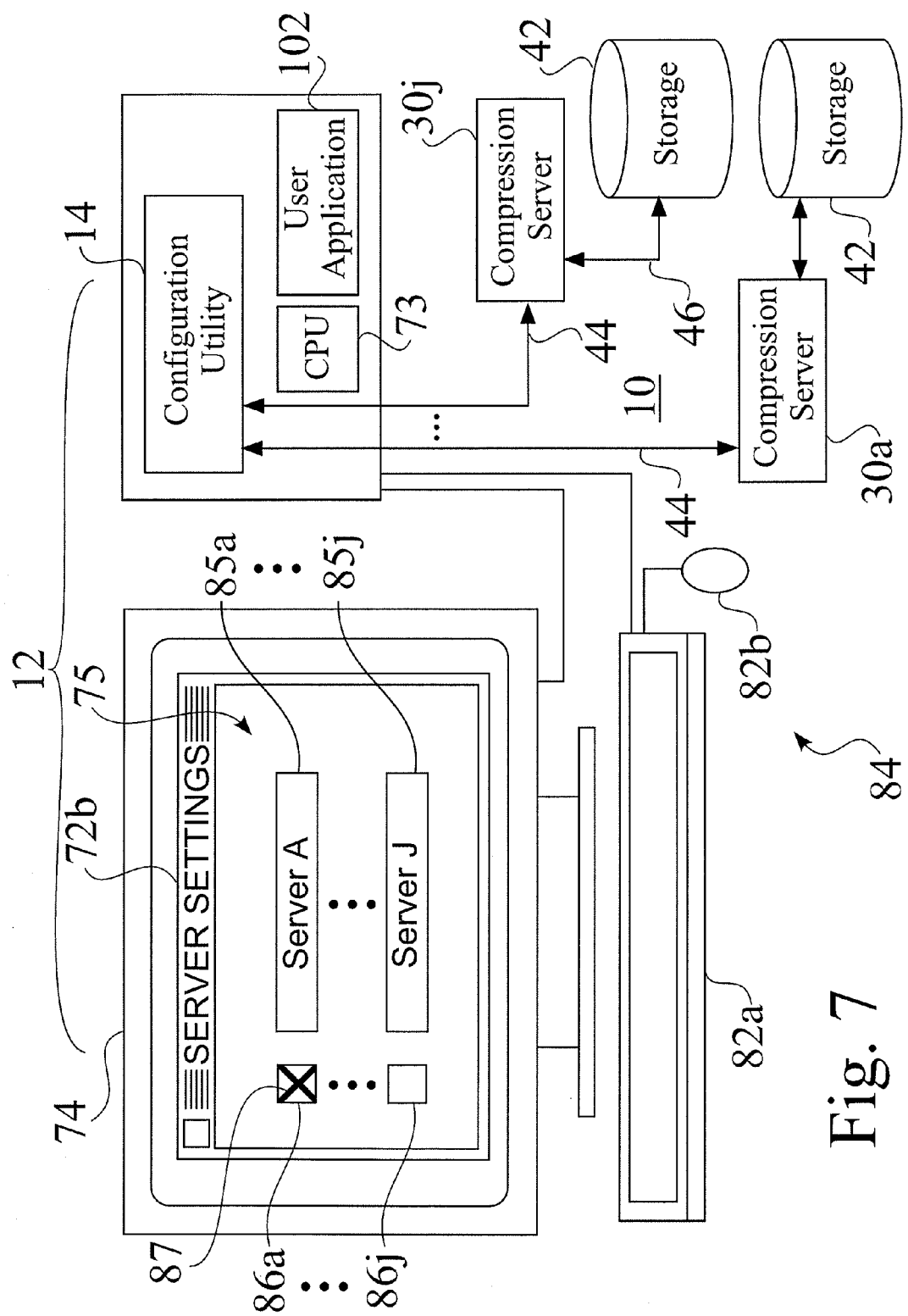
FIG. 7 is an exemplary schematic diagram for establishment of user settings of compression server selection through a configuration interface for an integrated data compression system.

FIG. 6 is a schematic diagram 70 for establishment of user preference settings 80 through a configuration interface 72, e.g. 72a, for an integrated data compression system 10. FIG. 7 is a schematic diagram 84 for establishment of user settings of compression server selection through a configuration interface 72, e.g. 72b, for an integrated data compression system 10. FIG. 8 is a schematic diagram 90 for establishment of user preference settings through a configuration interface 72 for a networked integrated data compression system 10 serving multiple user terminals 12, such as across a network 92.

The exemplary configuration interface 72a shown in FIG. 6 comprises means for selecting 78, 80, i.e. naming one or more file types 76, e.g. 76a-76n, to be performed on files 152 for the user USR at the user workstation 12, such as through a user application 102. The configuration interface 72a shown through the system display 74 of the workstation 12 may preferably comprise a graphic user interface (GUI), such as to display one or more selectable file types 76, e.g. 76a-76n, and means for selecting 78, 80 desired file types 76 as offered by the system 10. The exemplary selection means 78, 80 shown in FIG. 6 comprises check boxes 78, e.g. 78a-78n, associatively related to file types 76, e.g. 76a-76n that can be selected or deselected 80 by a user USR, typically through user input 82, such as but not limited to keyboard input 82a and/or mouse input 82b. While the exemplary selection means 78, 80 shown in FIG. 6 comprises check boxes 78, the selection means 78, 80 may comprise any of a wide variety of selection formats.

The exemplary configuration interface 72b shown in FIG. 7 comprises means for selecting 86, 87, i.e. naming one or more compression servers 30, e.g. 30a-30j, to be used by the system 10 for compression 114 and decompression 138 of files 152 for the user USR at the user workstation 12, such as through a user application 102. The configuration interface 72b shown through the system display 74 of the workstation 12 preferably comprises a graphic user interface (GUI) 75, such as to display one or more selectable names 85, e.g. 85a-85j, corresponding to compression servers 30, e.g. 30a-30j, and means for selecting 86, 87 desired compression servers 30 as offered by the system 10. The exemplary selection means 86, 87 shown in FIG. 7 comprises check boxes 86, e.g. 86a-86j, associatively related to compression servers 30, e.g. 30a-30j that can be selected or deselected 87 by a user USR, typically through user input 82, such as but not limited to keyboard input 82a and/or mouse input 82b. While the exemplary selection means 86, 87 shown in FIG. 6 comprises check boxes 86, the selection means 86, 87 may comprise any of a wide variety of selection formats.

While selection 86, 87 of compression servers 30, e.g. 30a-30j is typically made by a user USR through the configuration utility 14, such as through a configuration interface 72 associated with the configuration utility 14, the selection, i.e. designation of storage 42 is typically determined through the user application 102. For example, in various system embodiments 10, a user USR may select, through a user application 102, e.g. Adobe Premiere™, local storage 42 associated with a workstation 12, storage 42c associated with a network 94 of associated workstations 12, e.g. one or more dedicated servers 42c, or other storage 42, such as storage 42 accessible across a network 92 (FIG. 8), e.g. storage 42a associated with the system 10 and/or compression server 30, or other storage 42b across a network 92.

FIG. 9 is a process flow diagram 100 for file-type-based compression in an integrated data compression system 10. Data files 152 (FIG. 11, FIG. 12) are typically received 106 by the system 10 from a user application 102 such as by the interceptor 18. As needed, a determination 108 is made of the file type of the data file 152, if possible. In some system embodiments 10, if a determination 108 of file type cannot be made, such as if the data file 152 comprises an unknown format, the system 10 may allow direct storage 118 of the data file 152, or may perform blind compression if available on the associated file.

In the integrated data compression system 10, the files 152 in storage 42 are compressed and may have different file names. However, the filter mechanism shows these compressed files 152 as the original files 152, with original file names and original file sizes, to applications 102. When application programs 102 access these files 152 as before assuming they are the original non-compressed file, e.g. in the form ABC.DPX, the redirector 22 changes the file access to the compressed file, e.g. ABC.DPZ, and decompresses and presents the original file, e.g. ABC.DPX, to the application program 102. The application program 102 does not know that either the compression or decompression take place. The integrated data compression system 10 therefore provides transparent compression and decompression, since the application programs 102 do not realize that compression and decompression occur, while storage and communication are utilized more efficiently.

Furthermore, the types of files that are to be compressed, such as DPX files or TIFF files, can be selectively defined. Since different types of files have different formats for laying out the header information, video and audio, compression and decompression programs need to know which file types they are compressing, to perform compression efficiently. In the integrated data compression system 10, the redirector 22 checks the file type, e.g. such as for DPX files, TIFF files, or other file types, and then invokes file type specific compression and decompression programs, which is referred to in the integrated data compression system 10 as file-type-based compression.

As seen in FIG. 9, if a determination of file type of the data file 152 is made, the system 10 determines 110 if compression 114 is allowed, such as selected 64 by the user USR, for the file type of the data file 152, such as through the redirector 22. If the file-type-based compression 114 is not allowed 118, the data file 152 is transferred 120 for file storage 118, e.g. to storage 42 determined through the user application 102. If the file-type-based compression 114 is allowed 112, the data file 152 is compressed 114 using the selected 64 compression type 76, and transferred 116 to file storage 118, e.g. to storage 42 determined through the user application 102.

FIG. 10 is an exemplary process flow diagram 130 for file-type-based decompression 138 and delivery 140 in an integrated data compression system 10. As seen in FIG. 10, a file call, i.e. prompt 132 is made through the user application 102, such as when a user USR selectively acts to open a file 152, which had been previously processed by the system 10, e.g. such as through process 100 (FIG. 9). The system 10 receives 134 the request 132 for the data file 152, and retrieves 136 the data file 152 from storage 42, wherein the data file 152 may or may not be compressed 114, based on prior enablement or disablement 46 and/or based on determined 108 data file type. The system 10 then performs appropriate file-type-based decompression 138 as needed, and delivers 140 the data file 140 in an uncompressed state to the user application 102.

The integrated data compression system 10 and associated processes 60, 100, 130 can provide transparent and file-type-based compression 114 and decompression 138 to a wide variety of data files 152, such as but not limited to any of image files, audio files, video files, animation files, multimedia files, medical imaging files, security camera files and digital camera files 152.

The integrated data compression system 10 and associated processes 60, 100, 130 typically allow for compression and decompression work 114, 138 to be done on a compression server 30, rather than on the user's desktop, i.e. workspace 162 (FIG. 12), whereby the user CPU 73 is released from compression work 114, 138, and is therefore available for third party software 102.

As well, one or more compression servers 30 can be shared between client workstations, i.e. client machines 12, such as compression servers 30-30j seen in FIG. 7.

Figure 12:
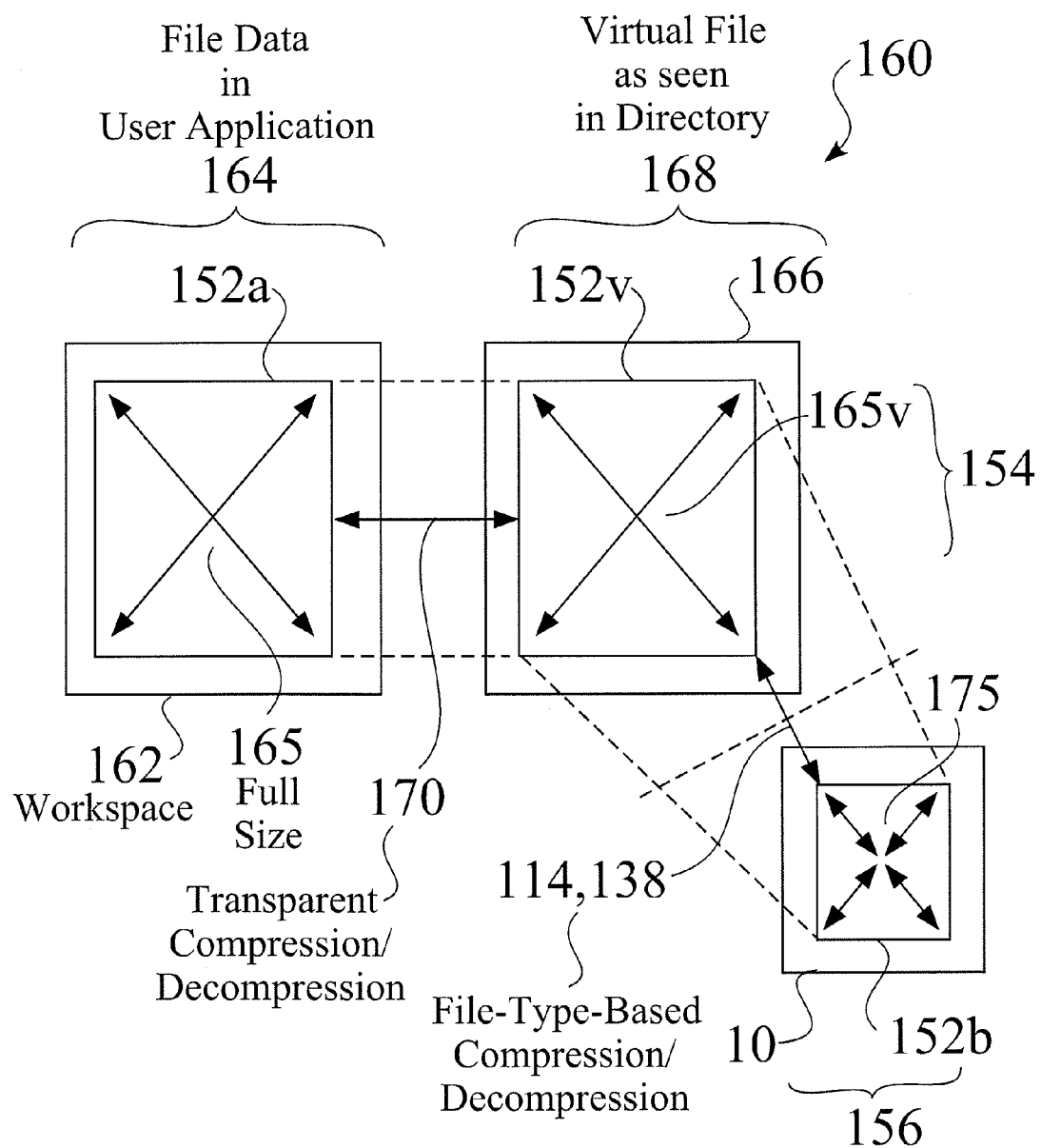
FIG. 12 shows a schematic comparison between a data file, a virtual data file associated with the data file, and a file-type-based compression and/or decompression of the data file as seen in real space.

FIG. 11 is a schematic illustration 150 of a virtual view 154 and an associated real view 156 associated with a user experience with an exemplary embodiment of an integrated data compression system 10 that provides transparent compression. FIG. 12 shows a schematic comparison between a data file 152, a virtual file associated with the data file 152, and transparent file-type-based compression 114 and/or decompression 138 of the data file 152 as seen in real space 156.

As seen in FIG. 11, a user USR at a client terminal, i.e. workstation 12, typically interacts with a data file 152 within a user application 102, such as working with a video or image data file 152 through associated video or image editing or compositing software 102. Through typical user operations 151 of saving, closing, and/or storing of a data file 152, the virtual view 154 of the file 152a, such as seen by the user USR, may preferably present the file 152a as a full size, uncompressed data file 152, which in FIG. 11 is represented by data file XY.DPX 152a.

As seen in FIG. 11, while the virtual view 154 presents a virtual file 152a to the user USR, the integrated data compression system 10 and associated processes 60, 100, 130 access the data file 152, e.g. 152a, such as through an interceptor filter 18, e.g. a Windows™ filter 18, to process the data file 152 access as an access to the real data file 152b, such as represented by data file XY.DPZ 152b, in a real space view 156. The integrated data compression system 10 and associated processes 60, 100, 130 shown in FIG. 11 therefore provide transparent compression 114, and decompression 138, such as defined by or otherwise allowed through the associated configuration utility application 14.

As seen in FIG. 12, in embodiments of the integrated data compression system 10 and associated processes 60, 100, 130 that provide transparent compression and decompression, such as compression 114, and decompression 138, a user USR may experience 164 a data file 152a as full size 165 within a workspace 162, such as through a user application 102. Through transparent compression/decompression 170, within the virtual view 154 (FIG. 11), the user USR experiences 168 a virtual data file 152v as full size 165v through the user workstation 12, such as within a directory 166.

However, as seen in the real view 156 in FIG. 12, transparent and file-type-based compression 115 and decompression 138 are performed, as defined by or otherwise allowed through the associated configuration utility application 14, which yields a real data file 152b within the real view 156, which in compressed form is shown in its true size 175, which may be significantly compressed, based on the compression settings and data file format.

The integrated data compression system 10 provides significant advantages for a wide variety of users USR and entities. For example, while a group of one or more users USR at client workstations 12 may desire the benefits of specific compression systems and processes, such as for specific video compression, e.g. Zaxel's mathematically lossless compression ZLC™, such users USR or user entities are often not prepared to invest in new hardware, and often prefer to use their existing hardware, e.g. workstations 12, servers and/or storage 42, such as preexisting video systems from established vendors.

For example, full featured video editing and authoring tools are often complex and may take years to develop. Users USR of such dedicated hardware are often reluctant to modify or upgrade such hardware and software, such as to attempt to integrate dedicated compression systems, or to discard existing systems that work to attempt to gain performance through new and often costly hardware and software. The integrated data compression system 10 inherently provides a significant advantages for such systems and users USR, since the system 10 is readily integrated with existing hardware and software, while providing networked data file compression that may preferably perform file-type-based compression duties 114, 138, as allowed or selected through the configuration utility 14, and may also preferably provide transparent compression/decompression 170.

Some functional embodiments of the integrated data compression system 10 and associated processes 60, 100, 130 are implemented over an Ethernet, such as to provide networked processing of data files 152. As well, the system performance is tunable, such as over a fiber channel. Stability testing of some system embodiments 10 is provided through synthetic input and output (IO). In addition, application specific testing and acceptance tests are typically performed to ensure successful integration for different system environments.

In some embodiments of the integrated data compression system 10 and associated processes 60, 100, 130, most software components comprise Windows® 32 or MFC software, and can provide automated and/or manual kernel dumping, based on system requirements and/or user expertise. Documentation is preferably provided, such as through HTML or integrated within the system software, e.g. context sensitive, indexed and/or menu driven, for any or all modules, and is preferably generated for specially formatted comments in new source files.

The integrated data compression system 10 and associated processes 60, 100, 130 provide "transparent compression". Digital video files 152 that are transferred between the application programs 102 and the storage 42 are intercepted by the interceptor 18 of the transparent compression system 10, and compressed without the need to modify the existing application programs 102. Application programs 102 continue to view these files 102 with the original names and sizes, even though they are compressed and may have different names. When these files 152 are accessed, they are loaded into memory and decompressed in the background. As seen in FIG. 12, the application programs 102 process the files 152 as original uncompressed files 152a.

Although the integrated data compression system and its methods of use are described herein in connection with workstations, client machines, servers, storage devices and other networked microprocessor-based devices, the system and techniques can be implemented for a wide variety of hardware and systems, or any combination thereof, as desired.

Accordingly, although the data compression has been described in detail with reference to a particular preferred embodiment, persons possessing ordinary skill in the art to which this invention pertains will appreciate that various modifications and enhancements may be made without departing from the spirit and scope of the claims that follow.

The invention claimed is:

1. A transparent compression system for at least one user terminal in a system in which digital data files are transferred between one or more applications programs and at least one storage facility, comprising:

at least one compressor;

a redirector for any of receiving digital data files from the compressor and sending digital data files to the compressor; and an interception module comprising means for receiving a digital data file from an associated user terminal, and means for selectively forwarding the digital data file to the redirector;

wherein the compressor receives digital data files selectively forwarded from the interceptor through the redirector, and provides compression without the need to modify the existing application programs with user settings;

wherein the one or more application programs can continue to view the digital data files with their original names and sizes, even though the digital data files are compressed and may have different names; and wherein when the digital data files are accessed, they are decompressed in the background.

2. The compression system of claim 1, further comprising:
a configuration module associated with each of the user terminals, the configuration module comprising means for entering user settings by a user.

3. The compression system of claim 2, wherein the configuration module comprises means for user selection of one or more of the compressors.

4. The compression system of claim 2, wherein the user settings comprise selective enablement of compression of the digital data file for at least one compression format;
wherein the compression of the digital data file allowed by the system is determined through any of selective enablement and selective disablement through the user settings.

5. The compression system of claim 2, wherein the configuration module comprises means for providing system error reporting.

6. The compression system of claim 1, further comprising a server located across a network from the user terminals, wherein the compressor is located at the server.

7. The compression system of claim 6, wherein the redirector is located at the server.

8. The compression system of claim 7, wherein the interceptor is located at the server.

9. The compression system of claim 1, wherein the digital data file comprises any of a video file, an image file, a sound file, a multimedia file, an animation file, a medical imaging file, a security camera file, and a digital camera file.

10. The compression system of claim 9, wherein a real view of the digital data file is in a compressed format, wherein a virtual view of the digital data file is in an original format, and wherein the real view of the digital data file and the virtual view of the digital data file is available to one or more applications, and wherein the applications can perform operations on any of the real view and the virtual view of the digital data file.

11. A process for transformation of digital data files in a computer environment in which digital data files are transferred between one or more applications programs and at least one storage facility, the process comprising the steps of:
establishing user preferences associated with a user terminal associated with the digital data files;
receiving a digital data file comprising a file type;
determining the file type of the received digital data file;
performing file type based compression of the received digital data file without the need to modify the existing application programs with user settings; and storing the file type based compressed received digital data file;

wherein the one or more application programs can continue to view the digital data file with its original name and size, even though the digital data file is compressed and may have a different name; and wherein when the compressed digital data file is accessed, it is decompressed in the background.

12. The process of claim 11, wherein the user preferences comprise identification of one or more compression servers associated with the file type based compression step.

13. The process of claim 11, wherein the user preferences comprise selective enablement of compression of the digital data file for at least one compression format;
wherein the step of performing file type based compression is determined by any of selective enablement and selective disablement through the user preferences.

14. The process of claim 11, further comprising the step of:
storing the received digital data file without compression if the compression is not selectively enabled by the established user preferences.

15. The process of claim 11, further comprising the step of:
storing the received digital data file without compression unless the file type is determined.

16. The process of claim 11, wherein the compression format comprises any of dpx, cin, tif, tgz and bmp.

17. The process of claim 11, wherein the digital data file comprises any of a video file, an image file, a sound file, a multimedia file, an animation file, a medical imaging file, a security camera file, and a digital camera file.

18. The process of claim 11, wherein the process is performed at the user terminal.

19. The process of claim 11, wherein at least a portion of the process is performed by a server across a network from a user terminal.

20. The process of claim 11, further comprising the step of:
designating a location to store the file type based compressed received digital data file;
wherein the file type based compressed received digital data file is stored at the designated location.

21. The process of claim 20, wherein the designated storage location comprises any of storage at a user terminal, storage associated with a network of user terminals, storage associated with means for performing the file type based compression step, and storage accessible across a network from any of a user terminal and compression means.

22. The process of claim 20, wherein a user terminal is associated with the digital data file, and wherein at least one of the user applications is located at the user terminal.

23. The process of claim 22, wherein the step of designating the location to store the file type based compressed received digital data file is performed in association with the user application.

24. The process of claim 22, wherein the user application is associated with any of editing and compositing any of video files, image files, sound files, a multimedia files and animation files.

25. The process of claim 22, further comprising the step of:
decompressing the file type based compressed received digital data file.

26. The process of claim 22, wherein the step of performing file type based compression is transparent to any of the user and the user application.

27. The process of claim 22, further comprising the steps of:

receiving a request from the user terminal for the stored file type based compressed received digital data file;

decompressing the stored file type based compressed received digital data file; and delivering the decompressed digital data file to the user terminal.

28. The process of claim 22, further comprising the steps of:

receiving a request from the user application at the user terminal for the stored file type based compressed received digital data file;

decompressing the stored file type based compressed received digital data file; and delivering the decompressed digital data file to the user application at the user terminal.

* * * * *